United States Patent [19]

Preslar

[11] 4,322,643
[45] Mar. 30, 1982

[54] DIGITAL PHASE COMPARATOR WITH IMPROVED SENSITIVITY FOR SMALL PHASE DIFFERENCES

[75] Inventor: Donald R. Preslar, Plainfield, N.J.

[73] Assignee: RCA Corporation, New York, N.Y.

[21] Appl. No.: 144,053

[22] Filed: Apr. 28, 1980

[51] Int. Cl.³ .......................................... H03D 13/00
[52] U.S. Cl. ..................................... 307/528; 328/133
[58] Field of Search ............... 328/133, 134; 307/272, 307/445, 514, 516, 525, 526, 527, 528

[56] References Cited

U.S. PATENT DOCUMENTS

| | | | |
|---|---|---|---|
| 3,610,954 | 10/1971 | Treadway | 307/528 |
| 3,710,140 | 1/1973 | Volmerange | |
| 3,714,463 | 1/1973 | Laune | |
| 4,023,116 | 5/1977 | Alfke et al. | |
| 4,122,405 | 10/1978 | Tietz et al. | 328/133 |
| 4,278,903 | 7/1981 | Ichinose | |

FOREIGN PATENT DOCUMENTS 1256164 12/1971 United Kingdom .
1328031 8/1973 United Kingdom .

OTHER PUBLICATIONS

"A New Design Technique for Digital PLL Synthesizers", by Eric Breeze, Published in IEEE Transactions on Consumer Electronics, vol. CE-24, No. 1, Feb. 1978.

"Test Your Charge Pump Phase Detectors", by William Egan, Published in Electronic Design, Jun. 7, 1978.
Technical Information on Integrated Circuit Types 11C00 Series, Published by Fairchild Semiconductor Group, Fairchild Camera and Instrument Corporation, 1978.
Integrated Circuit Application Note ICAN-6101, Published by RCA Corporation, 1978.

Primary Examiner—Alfred E. Smith
Assistant Examiner—T. N. Grigsby
Attorney, Agent, or Firm—E. M. Whitacre; P. J. Rasmussen; A. L. Limberg

[57] ABSTRACT

A digital phase comparator for essentially eliminating the dead zone in the phase correction means of a phase locked loop. The digital phase comparator is arranged to provide respective up and down output pulses to operate respective charge pumps. The up and down output pulses at all times are greater than a predetermined time duration no matter how small the phase difference between comparator input signals. A delay means is provided in the phase comparator logic, which delay means substantially determines such predetermined time duration. The minimum pulse duration of the up and down signals is selected to be at least of a duration sufficient to operate its respective charge pump, thereby overcoming the finite turn on time of the respective charge pump, no matter how small the phase error.

9 Claims, 6 Drawing Figures

DIGITAL PHASE COMPARATOR WITH IMPROVED SENSITIVITY FOR SMALL PHASE DIFFERENCES

BACKGROUND OF THE INVENTION

This invention relates to digital phase comparators as may be used in phase locked loops, and more particularly to phase comparators with improved sensitivity for detecting small differences in phase between input signals.

Phase locked loops (PLL) are used in diverse applications including frequency synthesizers, phase modulators, FM modulators, FM demodulators, radio frequency communication equipment, and controllers for variable speed electric motors.

The controlled variable in a PLL is phase. The phase of a first signal is compared to the phase of a second signal. The phase difference between the first and second signals is used in a feedback control system to bring the first and second signals into fixed phase relationship.

In a typical PLL, the first signal, a reference signal of reference frequency $f_r$, and the second signal, a controlled signal of variable frequency $f_v$, are compared by a digital phase comparator, which provides output indication proportional to phase error. The digital phase comparator has two outputs. One output (U) provides output pulses when the phase of the controlled signal is lagging with respect to the phase of the reference signal. When active, the duration of the U output pulses is proportional to the amount of phase lag. Conversely, the other output (D) provides output pulses when the phase of the controlled signal is leading with respect to the phase of the reference signal and, when active, the duration of the D output pulses is proportional to the amount of phase lead.

In a PLL, the U and D output signals from the phase detector are converted to ternary logic form and applied to an integrator to increase or decrease, respectively, the level of an output control voltage. In particular, the U output pulses operate a first charge pump to source current to a circuit node. The D output pulses operate a second charge pump to sink current from the same circuit node. The net current at such circuit node is integrated over time by a capacitor connected to the node to provide an output control voltage proportional to the time integral of detected phase error.

In the system just described, the phase comparator, the two charge pumps, and the integrator, comprise the phase correction portion of a PLL. The output of the phase correction means in turn operates a voltage controlled oscillator (VCO), the output of which is the controlled signal $f_v$. A phase error exists between the reference signal and the controlled signal until the PLL adjusts the frequency of the controlled signal to be substantially equal to the frequency of the reference signal.

In the prior art, phase correction means in PLL's are incapable of detecting small differences in phase between the reference signal and the control signal. Thus a "dead zone" exists between phase lead and phase lag in which the loop phase correction means is insensitive to small phase errors. The dead zone is generally undesirable because, as the loop frequently drifts, the loop feedback mechanism cannot correct for the drift until the phase error becomes large enough to extend past the dead zone of the phase correction means. Therefore, the dead zone permits random frequency modulation as the loop frequency and phase wanders from one end of the dead zone to the other, which frequency modulation degrades the spectral purity of the PLL signal.

The overall PLL system dead zone results from several sources. The phase comparator may itself have a dead zone. That is, when the phase error is very small, neither U or D pulses may be produced. However, the major cause of the dead zone is attributed to the response of the charge pump to the U and D pulses. For example, even if the phase detector had ideal characteristics in the region about zero phase error, a dead zone would be created by the minimum turn on time of the charge pump alone. That is, when the phase error is very small, the U and D pulses may be so narrow as to have no appreciable effect on the charge pump output.

One prior art solution to the above described dead zone problem is to deliberately introduce leakage into the integrator means. This causes the integrator output to tend to droop with time, which droop is counterbalanced by the loop feedback. However, this technique is not desirable since it increases the amplitude of the sidebands at the reference frequency.

Another prior art solution to the above described problem is disclosed in U.S. Pat. No. 4,023,116 to Alfke, et al wherein a deliberate error pulse is injected on the D signal which produces a compensating phase error pulse from the phase comparator on the U signal. The phase comparator and phase correction means is thus effectively operated away from, or outside of, its dead zone. Such operation, however, produces a phase locked output signal having an undesirable phase error with respect to the reference frequency. Furthermore, introduction of error pulses into a PLL can adversely effect loop transient characteristics and increase system susceptibility to jitter.

BRIEF SUMMARY OF THE INVENTION

An aspect of the present invention is embodied in a phase comparator including means for generating at least one of the U and D signal pulses, if not both, having sufficient output amplitude and duration to operate its respective charge pump no matter how small the input phase error. Another aspect of the present invention is embodied in a digital phase comparator wherein both of the U and D signals are produced for each cycle of the reference frequency no matter how small the phase error. That is, even in response to in-phase input signals, both U and D output pulses are provided of sufficient amplitude and duration to operate its respective charge pump. In the preferred embodiment shown, a digital phase comparator includes a delay means wherein the predetermined time delay provided by the delay means controls the minimum time duration of the U and D output pulses.

DESCRIPTION OF A PREFERRED EMBODIMENT

Figure 1:
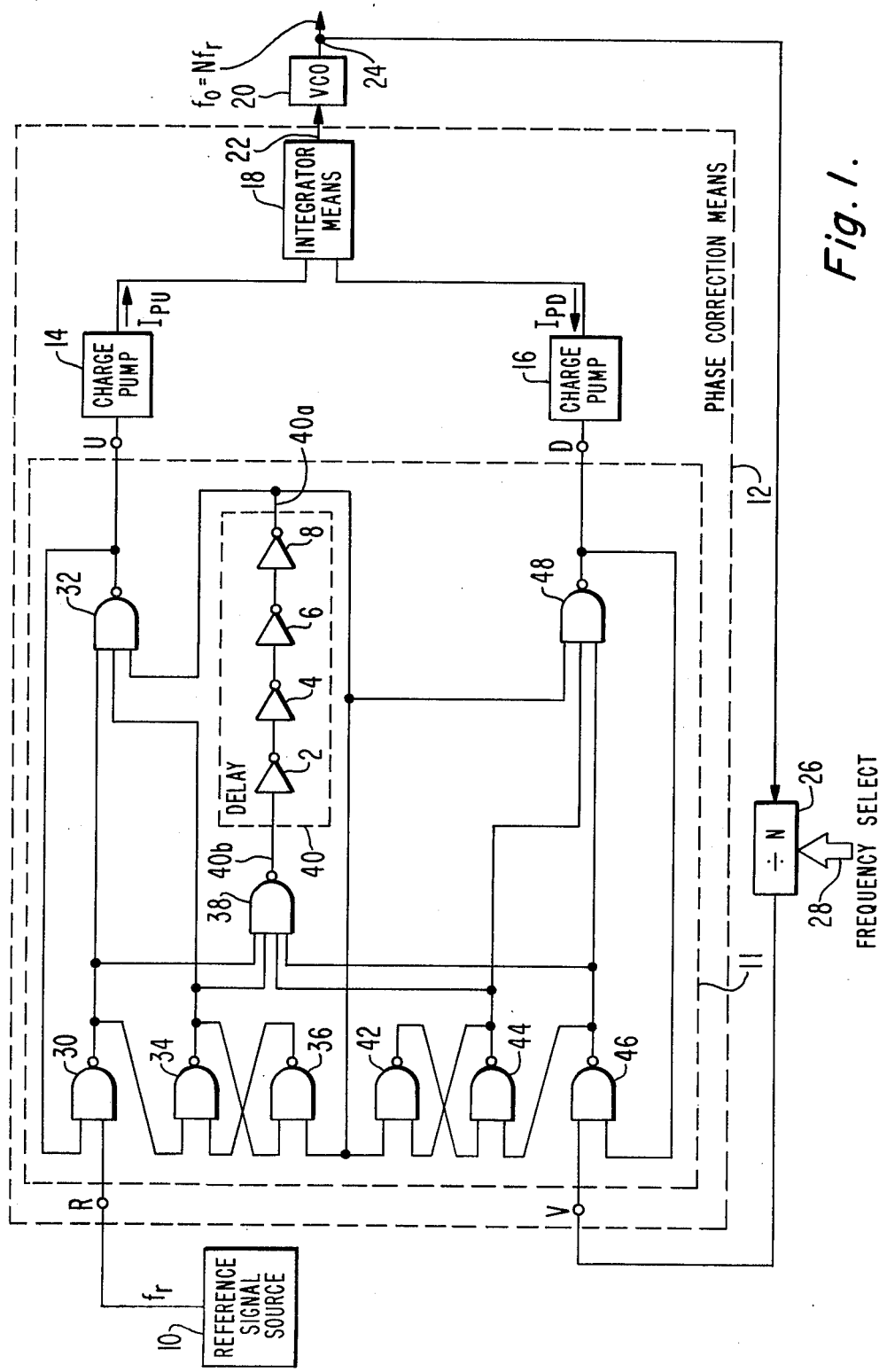
FIG. 1 is a block diagram of a PLL including a phase comparator embodying the present invention.

FIG. 1 shows a PLL used in a frequency synthesizer for generating precise multiples of a reference frequency $f_r$. Such frequency synthesizer is suitable for controlling a tunable local oscillator in a radio receiver. The output signal at terminal 24 has a a frequency $f_o$ which is N times the reference frequency $f_r$, N being an integer selectable by the user.

The PLL consists of a VCO 20, a programmable divide by N counter 26, a reference signal source 10, and a phase correction means 12. The phase correction means 12 in turn comprises a phase comparator 11, a first charge pump 14, a second charge pump 16, and an integrator means 18. The VCO 20 is responsive to the voltage input on a conductor 22 to provide an output signal at terminal 24 of a frequency proportionally related to the magnitude of such input voltage. The output of the VCO 20 is fed to a programmable divider 26 which divides the frequency of the signal from the VCO by a factor of N. The division factor N, is selectable by suitable means 28 such as parallel inputs from thumbwheel switches to the programmable divider 26.

The frequency divided output from divider 26 is fed to input terminal V of the phase comparator 11. The other input terminal, R, of the phase comparator 11 is cross-connected to receive the reference signal from source 10. For each cycle of the reference signal, the phase comparator 11 is presented with signal transition on its two input terminals, R and V, with which to determine the amount and direction of any phase error. If the phase of the signal on terminal V is leading with respect to the phase of the signal on terminal R, then an output signal of the phase comparator 11 on terminal D is a digital pulse signal of duration proportionally related to the amount of such phase lead. Conversely, if the phase of the signal on terminal V is lagging with respect to the phase of the signal on terminal R, then the other output signal of the phase comparator 11 on terminal U is a digital pulse signal of duration proportionally related to the amount of such phase lag.

The respective output signals on conductors U and D are fed to respective charge pumps 14,16. Charge pump 14 is a switched current source responsive to a logical 0 on terminal U to source current $I_{PU}$ to integrator means 18, and responsive to a logical 1 to provide essentially no current to integrator means 18. Similarly, charge pump 16 is a switched current source responsive to a logical 0 on terminal D to sink current $I_{PD}$ from integrator means 18, and responsive to a logical 1 to provide essentially no current to integrator means 18. Currents $I_{PU}$ and $I_{PD}$ are of substantially equal magnitude but opposite polarity. The output of integrator means 18 is a voltage representing the time integral of the current provided by charge pumps 14 and 16, which output voltage is therefore proportional to the total net charge delivered to integrator means 18. Since the switched current sources 14,16 are controlled by the U and D signals, respectively, the change in output voltage from integrator means 18 is proportionally related to the phase difference, or the phase error, between comparator input signals on terminals V and R. The output of the integrator means 18 on conductor 22 is the control input to the VCO 20.

In operation, the loop feedback from the output of the VCO 20 to the input of the phase detector 11 will operate to phase lock the output signal to the reference signal in such manner so that the frequency of the output signal will be N times the reference frequency. If the frequency of the output 24 of the VCO 20 drifts so that the phase of the divided output signal on terminal V of phase comparator 11 is leading with respect to the phase of the reference frequency signal on terminal R thereof, which corresponds to an increase in VCO frequency, the duration of the pulse signal on terminal D tends to increase. This will cause the time duration that $I_{PD}$ flows to increase, and tends to cause the integrator 18 output on conductor 22 to decrease. Such decrease, will decrease the frequency of the VCO 20 output so as to bring the frequency of the VCO output signal into a fixed phase relationship with the reference signal. If the VCO output frequency drifts so that the phase of the signal on terminal V is lagging with respect to the reference signal on terminal R thereof, which corresponds to a decrease in VCO frequency, then the duration of the signal pulse on terminal U tends to increase. This will cause the time duration that $I_{PU}$ flows to increase, and tends to increase the output of integrator means 18 on conductor 22. Such increase will increase the frequency of the VCO 20 output so as to bring the VCO output signal into a fixed phase and frequency relationship with the reference signal.

The phase comparator 11 comprises a two-input NAND gate 30 and a three-input NAND gate 32 cross-coupled to form a first flip-flop; a pair of two-input NAND gates 34 and 36 cross-coupled to form a second flip-flop; a two-input NAND gate 46 and a three-input NAND gate 48 cross-coupled to form a third flip-flop; and a pair of two-input NAND gates 42 and 44 cross-coupled to form a fourth flip-flop. These flip-flops are interconnected with NAND gate 38 and delay means 40 to operate as a phase comparator 11 in accordance with the present invention. Specifically, the first flip-flop 30,32 is set responsive to the signal on terminal R via a connection from terminal R to an input of gate 30. The second flip-flop 34,36 is set responsive to the reset state of the first flip-flop 30,32 via a connection from the output of gate 30 to an input of gate 34. The first flip-flop 30,32 is reset responsive to the reset state of the second flip-flop 34,36 via a connection from the output of gate 34 to an input to gate 32. Similarly, the third flip-flop 46,48 is set responsive to the signal on terminal V via a connection from terminal V to an input of gate 46. The fourth flip-flop 42,44 is set responsive to the reset state of the third flip-flop 46,48 via a connection from the output of gate 46 to an input of gate 44. The third flip-flop 46,48 is reset responsive to the reset state of the fourth flip-flop 42,44 via a connection from the output of gate 44 to an input to gate 48.

When all four flip-flops are set, the output 40b of NAND gate 38 to delay means 40 goes low. A predetermined time later, the output 40a of delay means 40 goes low, resetting all four flip-flops via a common connection from delay means output 40a to a respective input of NAND gates 32, 48, 36 and 42.

Phase comparators including four flip-flops arranged in a similar fashion to the four flip-flops of phase comparator 11, but without delay means 40, are known in the art. Such conventional four flip-flop phase comparator is described in detail in Integrated Circuit Application Note, ICAN-601 published by RCA Corporation. The four flip-flop phase comparator (in a basic form and as modified in accordance with an aspect of the present invention by inclusion of delay means 40) is advantageous because it has a wide pull in range and places no constraints on the duty cycle of the inputs applied to the phase comparator. As shown in the above mentioned application note, these phase comparators have twelve internal states. Four internal states in response to input signals on terminals R and V provide a logical 1 output signal on terminal U and a logical 0 output signal on terminal D. Four other internal states in response to input signals on terminals R and V provide a logical 0 output signal on terminal U and a logical 1 output signal on terminal D. The remaining four internal states provide a logical 1 output signal on both U and D terminals. The phase comparator described in ICAN-601 does not have a stable state in which the signals on U and D terminals will both be at logical 0. As previously mentioned, the respective comparator output pulses on U and D terminals operate respective charge pumps to source or sink current at an output node. A dead zone can exist in the prior art phase detection means because for small phase differences between comparator input signals, the U and D pulses are of such short time duration as to be less than the turn on time (defined as the propagation delay plus the rise time) of the respective charge pumps.

The prior art phase comparator is modified according to an aspect of the present invention to include the delay means 40 for providing a delay in resetting the four flip-flops, so that the transition time between certain states is lengthened. Accordingly, there is a lengthened period of time between stable states during which the U and D terminals are both at logical 0. Naturally, NAND gate 38 has some inherent delay which tends to cause a finite transition time between certain stable states during which the U and D terminals are both at logical zero. However, such period of simultaneous logic 0 output caused by the normal propagation delay of NAND gate 38 above will not exist for any appreciable period sufficient to correct the above described dead zone problem. Thus, a further aspect of the present invention is that the means 40 provides sufficiently long time delay to add a period of logical 0 output to the pulse signals on both the U and D terminals during each cycle of the reference frequency for sufficient time to turn on each of said charge pumps 14,16. The dead zone due to the finite turn on time of the charge pumps is eliminated because the delay means 40 adds sufficient time duration to both the U and D output pulses to overcome the minimum turn on time of each respective charge pump, no matter how small the comparator input phase error. Therefore, during each cycle of the reference frequency, each charge pump is turned on and operated to provide at least some predetermined minimum charge transfer. The net charge delivered to integrator means 18, equal to the difference between the charge supplied by charge pumps 14 and 16, is proportional to the detected phase error.

In FIG. 1, delay means 40 comprises a plurality of logical inverters 2, 4, 6, 8 connected in series. The input 40b to the series connected inverters 2, 4, 6, 8, is connected to reset the four flip-flops. If more delay is necessary, additional inverters may be added in series.

Figure 4:
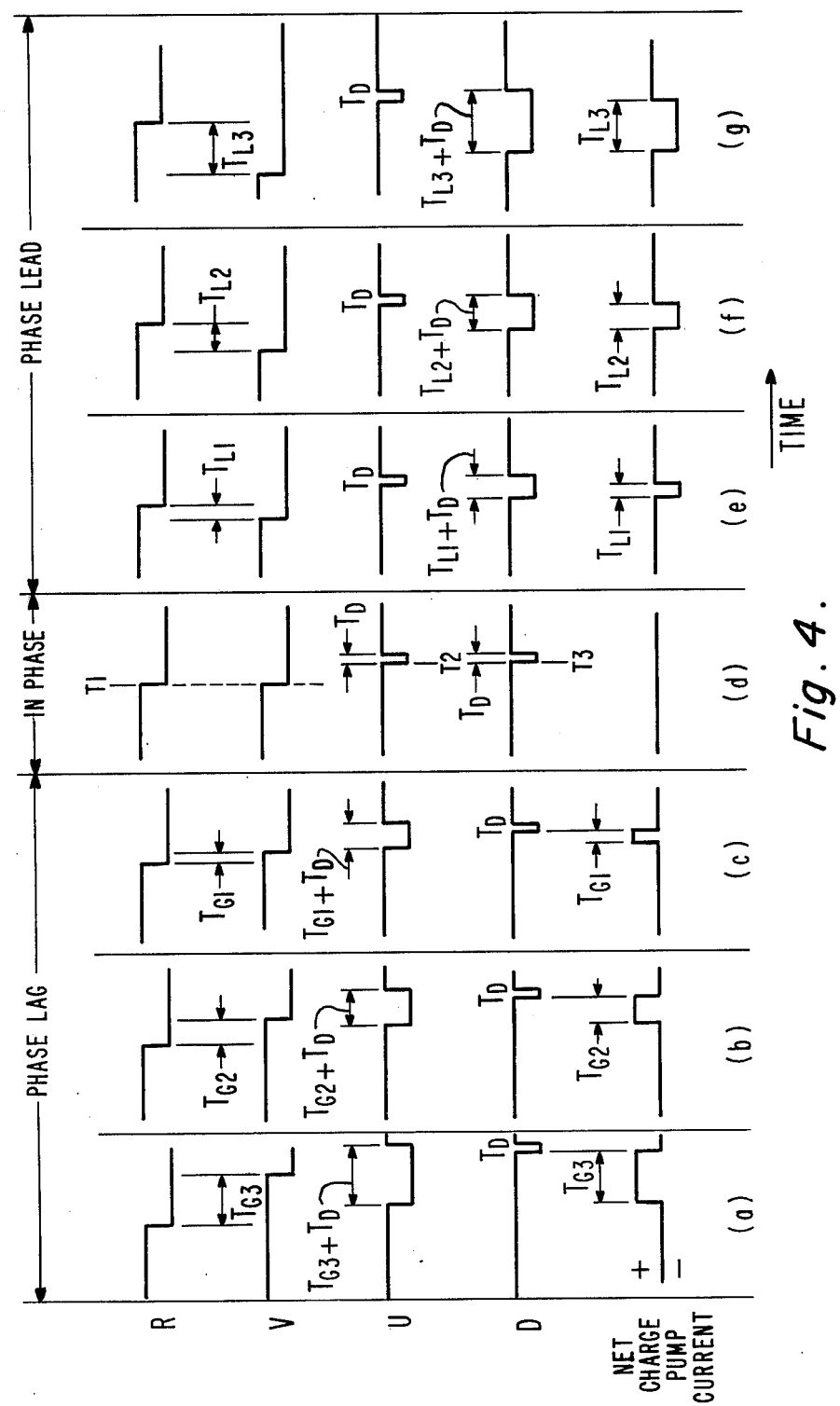
FIGS. 4a–4g are respective timing diagrams illustrating the response of a phase comparator and charge pump of FIG. 2 for various respective conditions of phase lag, phase lock, and phase lead between reference and variable input signals.

FIG. 4d illustrates the respective output signals at terminals U and D for a condition of phase lock. Responsive to the negative edge of the reference signal applied at time T1, to terminal R, the output signal at terminal U goes low a short time later at time T2. The delay from T1 to T2 is equal to the propagation delay of NAND gates 30 and 32 in FIG. 1. Responsive to the negative edge of the divided VCO signal (terminal V) also at time T1 in FIG. 4d, the output signal at terminal D goes low a short time later at time T2. The delay from T1 to T3 is equal to the propagation delay of NAND gates 46 and 48 in FIG. 1. The output at terminal U will go high again after a delay equal to the sum of the propagation delays of NAND gates 30, 38 and 32 plus the delay of delay means 40. Similarly, the output at terminal D will go high again after a delay equal to the sum of the propagation delays of NAND gates 46, and 48 plus the delay of delay means 40. If it can be assumed that the delays of all gates are approximately equal then both pulses on the U and D terminals, at phase lock, will begin coincidentally and both be substantially the same pulse width, $T_D$, as shown in FIG. 4d. In the preferred embodiment, the delay introduced by delay means 40 is chosen so that the minimum pulse width, $T_D$, of the U and D signals is equal to or greater than the pulse width necessary for them to turn on the charge pumps 14 and 16 respectively. The operation of phase comparator 11 for various conditions of phase lag and phase lead errors can be seen from FIGS. 4a through 4c and 4e through 4g respectively. Note how the signal width on terminal U increases for three conditions of increasing phase lag, i.e., $T_{G1}$, $T_{G2}$, and $T_{G3}$ in FIGS. 4c, 4b, and 4a respectively. However, for increasing phase lead, the signal width on terminal U remains at $T_D$ as shown in FIGS. 4e, 4f and 4g. The signal width on terminal D however increases for three conditions of increasing phase lead, i.e., $T_{L1}$, $T_{L2}$, and $T_{L3}$ in FIGS. 4e, 4f, and 4g respectively. For increasing phase lag, the signal width on terminal D remains at $T_D$ as shown in FIGS. 4c, 4b, and 4a. Therefore, both at phase lock and for conditions of phase lead and lag errors, the phase detector 11 provides U and D signals exhibiting a pulse width greater than a predetermined minimum required for turning on charge pumps 14 and 16 respectively. The net current provided by both charge pumps 14, 16 for each respective condition of phase lead and phase lag is also shown in FIGS. 4a through 4g. In FIGS. 4a through 4c, the net current is positive, having a predetermined magnitude, and is applied for a time duration proportional to the amount of phase lag $T_{G3}$, $T_{G2}$, and $T_{G1}$ respectively. In FIGS. 4e through 4g, the net current is negative, having a predetermined magnitude, and is applied for a time duration proportional to the amount of phase lead $T_{L1}$, $T_{L2}$, and $T_{L3}$ respectively.

At phase lock, in FIG. 4d, no net charge is delivered to integrator means 18. While it is assumed that the respective output pulses on U and D terminals are essentially simultaneous at phase lock, it will be recognized that the current output pulses from the charge pumps 14,16 may be skewed in time due to unequal propagation delays in the charge pumps 14,16. However, such unequal delays will not change the net charge delivered to, or removed from, integrator means 18.

Figure 3A:
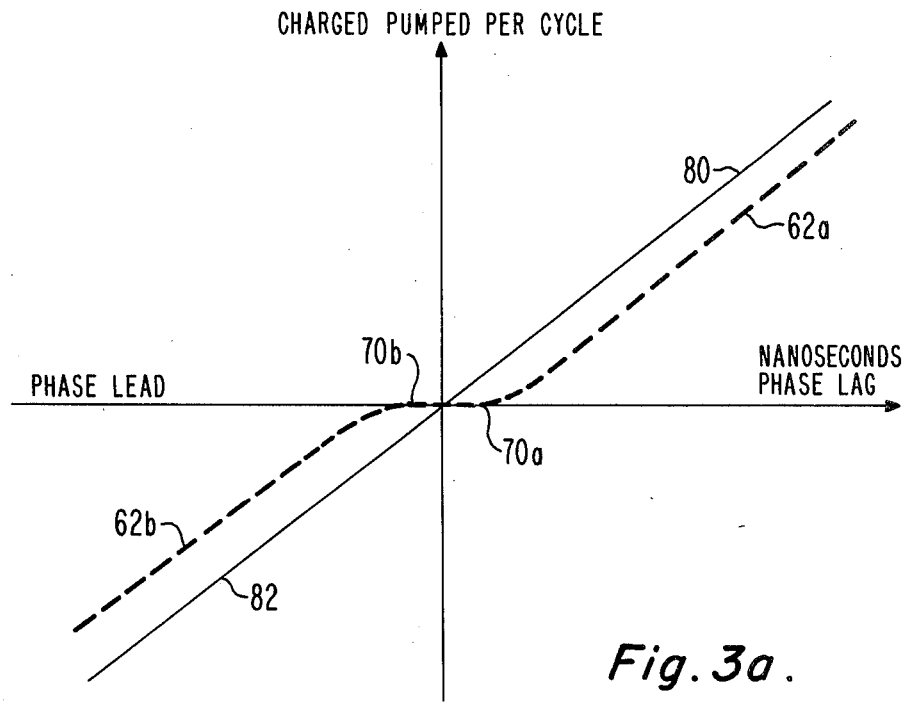
FIG. 3a illustrates the response of a phase comparator and charge pump known in the prior art.

FIG. 3a illustrates the response of the phase comparator and charge pumps without delay means 40. For present purposes, the propagation delay of NAND gate 38 is assumed to be small enough so that its effect can be neglected. Curve 80 represents pulse duration versus phase error for the U output signal. The curve represented by a dashed line 62a illustrates the response of charge pump 14 to the U signal. For charge pump curve 62a, the vertical axis is total charge delivered to, or removed from, integrator means 18 per cycle of the reference frequency, and the horizontal axis is phase error as determined by the phase detector comparison of signal transitions during a cycle of the reference frequency. It can be seen that below some minimum pulse width of the U signal, less than the turn on time for the charge pump 14, the charge pump 14 delivers no charge, thereby causing a zero response in the region near zero phase error 70a. Curves 82 and 62b illustrate analogous responses for the D signal and charge pump 16, respectively. The dead zone is composed of regions 70a, 70b for small values of phase lag and phase lead.

Figure 3B:
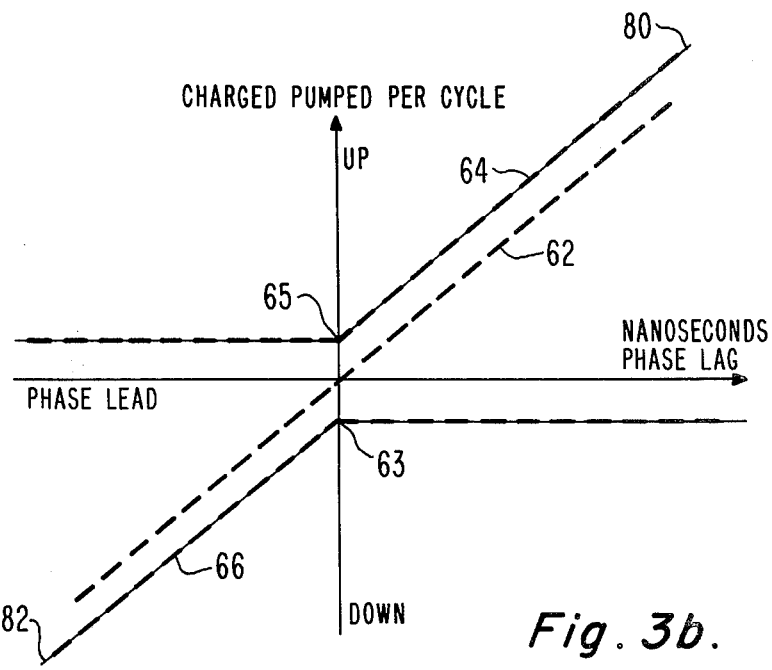
FIG. 3b illustrates the response of a phase comparator and charge pump in accordance with the present invention.

The idealized transfer characteristics for a phase detector and charge pump in accordance with the present invention are illustrated in FIG. 3b. Curves 80 and 82 represent the response of the U and D signals respectively, versus phase error. Curve 64 is the response of the charge pump 14 to the U signal; curve 66 is the response of the charge pump 16 to the D signal. Note that the charge pumps 14 and 16 are operated so as to source or sink charge at zero phase error no less than a predetermined minimum as indicated by points 65 and 63 respectively on the vertical axis. The net charge delivered to integrator means 18 is the sum of curves 64 and 66 and is indicated by curve 62. Increasing the duration of the delay introduced by delay means 40 shifts curves 64, 80 upward and curves 66,82 downward in equal and opposite amounts, but the net transfer curve 62 remains essentially unchanged. Therefore, the amount of delay introduced by delay means 40 may be larger than the minimum delay necessary to provide the minimum width output pulses necessary to turn on charge pumps 14 and 16. However, additional delay increases the circuit power consumption and also tends to exaggerate the effect of any mismatch between charge pumps 14 and 16. Therefore, it is best to select a value of the delay for delay means 40 which is only slightly larger than that which provides minimum width output pulses to turn on respective charge pumps 14,16 under worst case process, material, and environmental conditions.

Figure 2A:
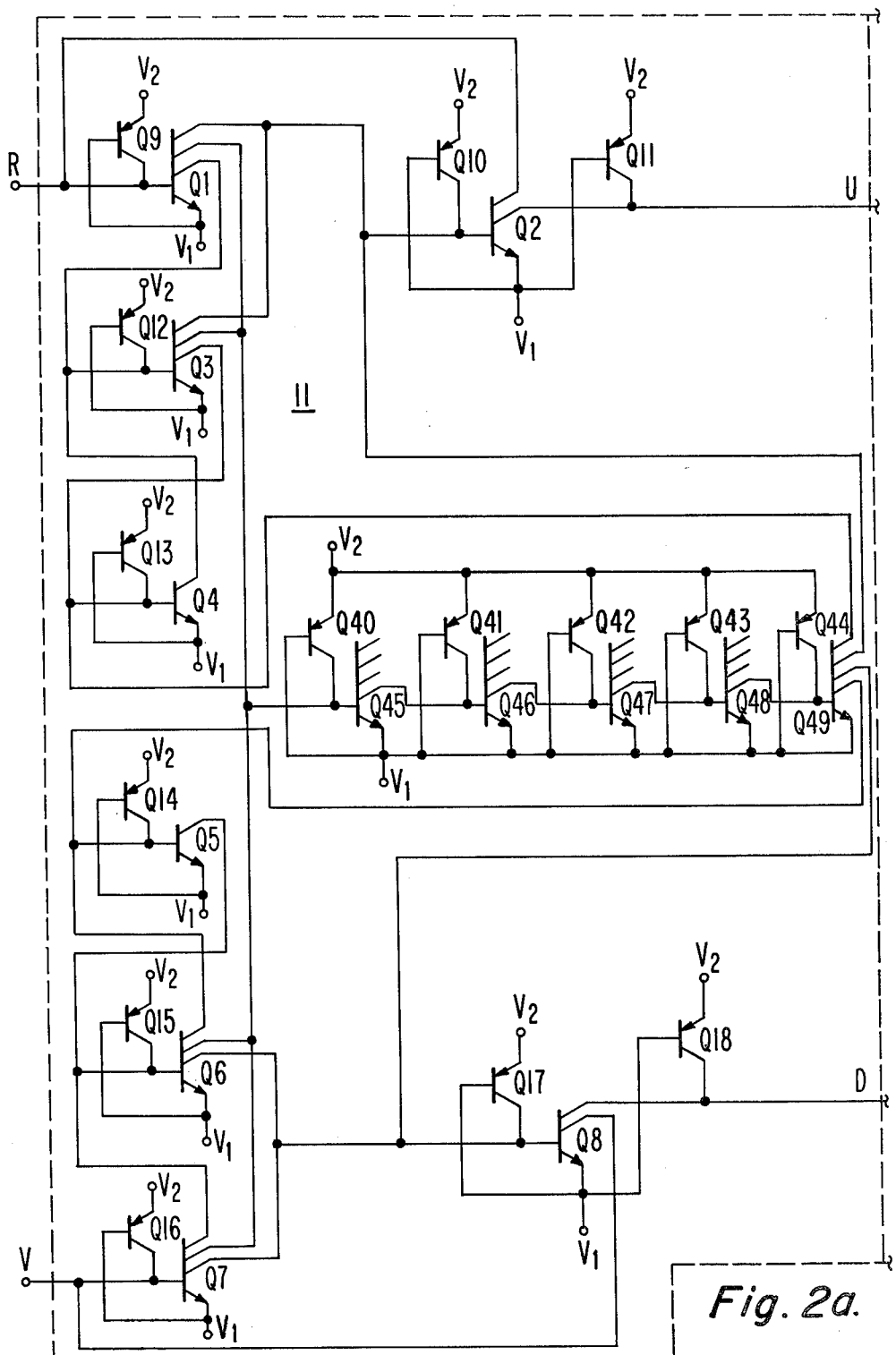
FIGS. 2a and 2b are parts of a single schematic diagram, with electrical connections at lines labelled U and D, of a preferred embodiment of a phase comparator in accordance with the present invention.
Figure 2B:
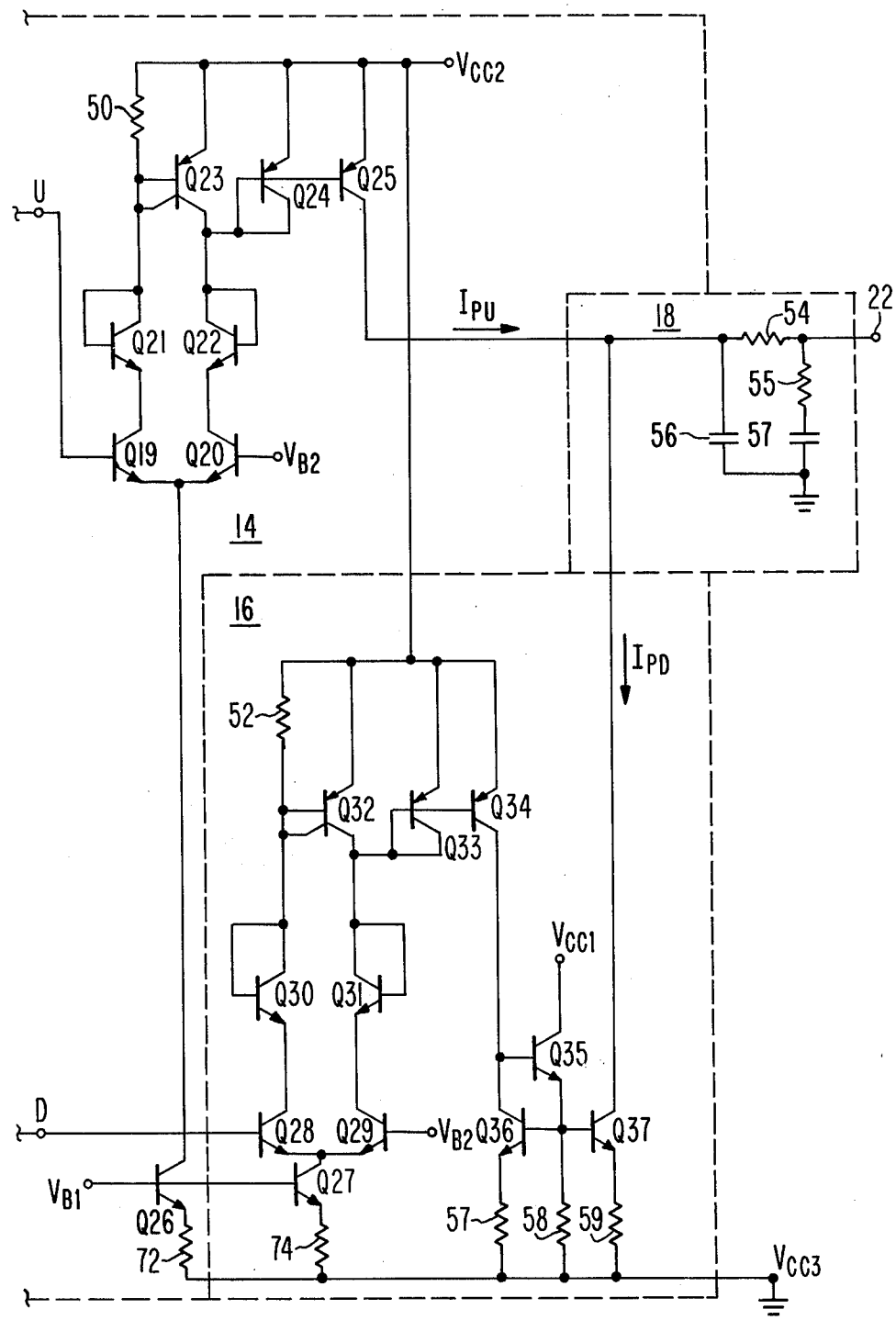

A specific embodiment of the phase correction means 12 of FIG. 1 is shown in FIGS. 2a and 2b which, as earlier mentioned, are part of the same schematic diagram, electrically connected at the lines labelled U and D, and should therefore be referred to together. Terminals $V_{CC1}$, $V_{CC2}$, and $V_{CC3}$ are connected to respective sources of suitable operating potential. As a specific example, $V_{CC1}$ equals 5 volts, $V_{CC2}$ equals 10 volts, and $V_{CC3}$ equals 0 volts. Terminals V1 and V2 are connected to receive a current therebetween from a constant current source (not shown). The approximate potentials at terminals V1 and V2 at room temperature at 4.1 volts and 4.8 volts, respectively.

The phase comparator 11, comprising transistors Q1 through Q18 and Q40 through Q49, is realized in bipolar integrated injection logic (I²L) by techniques known to those skilled in the art. Cross-coupled transistors Q1, Q2, and their respective current injector transistors Q9, Q10, form the first flip-flop. Cross-coupled transistors Q3, Q4 and their respective current injector transistors Q12, Q13 form the second flip-flop. Cross-coupled transistors Q7, Q8 and their respective current injector transistors Q16, Q17 form the third flip-flop, and cross-coupled transistors Q5, Q6 and their respective current injector transistors Q14, Q15 form the fourth flip-flop.

The four-input NAND gates 38 of FIG. 1 comprises transistor Q45 and its current injector transistor Q40 in FIG. 2. In I²L, each respective input to a NAND gate is formed by providing a separate collector region at the output transistor of the previous stage. For example, the four inputs to NAND gate transistor Q45 are made by connecting a separate collector region from Q1, Q3, Q6, and Q7 to the base electrode of transistor Q45. Delay means 40 of FIG. 1 is realized in FIG. 2 by a series connection of four inverting buffers, each inverting buffer comprising one of transistors Q46 through Q49 respectively in conjunction with a respective current injector transistor Q41 through Q44. Each transistor, Q46 to Q49 is provided with four separate collector regions to reduce the switching time thereof, which tends to thereby increase the total time delay realized. As a typical example, the four transistors Q46 to Q49 in FIG. 2 introduce a signal delay of 300 nanoseconds with 70 microamperes bias on each gate. If greater delay is required, then more pairs of inverters may be added in series therewith. At the phase comparator output terminals, U and D, current injector transistors Q11 and Q18 are connected as active pull-up devices to supply respective output current to charge pumps 14 and 16 respectively.

Charge pump 14 comprises a constant current source Q26 and emitter resistor 72, a differential amplifier Q19, Q20, a balanced-to-single-ended converter Q23, and a current mirror amplifier output stage Q24, Q25. The base electrode of Q26 is connected to terminal $V_{B1}$ which is connected to a source of bias potential for conditioning Q26 to conduct a constant current through its collector-to-emitter principal current conduction path. Such constant current is supplied to emitter-coupled differential amplifier transistor pair Q19, Q20, which current is differentially switched according to the potential difference between the base electrodes of transistors Q19 and Q20. The base electrode of transistor Q20, at terminal $V_{B2}$ is held at a fixed bias potential which is between the potentials at terminals V1 and V2. A bias potential supply may be realized by a voltage divider comprising resistors of equal value connected in series between V1 and V2 and connected at the interconnection thereof to terminal $V_{B2}$. In operation, when the potential at terminal U is at V1 potential (via conduction by transistor Q2), corresponding to a logical 0 output at terminal U, transistor Q20 is rendered conductive and Q19 is rendered non-conductive, inasmuch as the base voltage of Q20 is substantially greater than that of Q19. Split collector transistor Q23 and resistor 50 comprise a current mirror amplifier with its input path connected to conduct current provided through the collector of transistor Q19, its output path connected to supply the current provided through the collector of transistor Q20, and its common terminal connected to $V_{CC2}$. Since transistor Q19 is non-conductive and transistor Q20 is conductive, transistor Q23 will be rendered non-conductive and transistor Q24 rendered conductive. Transistors Q24 and Q25 comprise another current mirror amplifier for providing an inverted output current $I_{PU}$.

When the potential at terminal U is at V2 potential (via conduction by pull up transistor 11), corresponding to a logical 1 output at terminal U, transistor Q19 is rendered conductive and transistor Q20 is rendered non-conductive, as the base electrode of Q19 is substantially greater than that of Q20. Under these conditions, transistor Q23 is conditioned for conduction and transistor Q24 is conditioned for non-conduction. Thus, charge pump 14 operates as a switched current source responsive to the signal at terminal U to source a constant magnitude current $I_{PU}$ to integrator means 18 when the signal at terminal U is at a logical 0, and to source essentially no current to integrator means 18 when the signal at terminal U is at logical 1.

The purpose of diode-connected transistor 22 is to protect transistors Q20 and Q23 in the event that upon turn on, the power supply providing bias potential to terminal $V_{B2}$ at the base of Q20 will come up in voltage before the power supply providing operating potential to terminal $V_{CC2}$ can come up in voltage. If so, then the collector-base junctions of transistors Q20 and Q23 would be forward-biased in series possibly damaging one or both devices. To prevent such damage, a unidirectional current conduction means Q22 is used to interconnect the collector electrodes of transistors Q23 and Q20. For similar reasons, to protect an isolation diode formed as part of resistor 50, a diode-connected transistor Q21 is used to connect the other collector of transistor Q23 to the collector of transistor Q19.

Charge pump 16 comprises a constant current source transistor Q27 and emitter resistor 74, a differential amplifier Q28, Q29, a balanced-to-single-ended converter Q32, and a current mirror amplifier output stage Q33, Q34. The circuit operation of charge pump 16 is analogous to that of charge pump 14, described above, to produce an output current through the collector emitter path of Q34. However, charge pump 16 has an additional current mirror amplifier comprising transistors Q35, Q36, Q37, and resistors 57, 58, 59 to invert the polarity of output current $I_{PD}$ applied to integrator means 18. The additional current mirror amplifier comprises transistor Q36 as the input device, and transistor Q37 as the output device. The common terminal of current mirror amplifier Q36, Q37 is connected to terminal $V_{CC3}$. Transistor Q35 and resistor 58 provide a base current bypass means to reduce base current error. Emitter degeneration resistors 57 and 59 improve the matching of input and output characteristics.

Thus, charge pump 16 is a switched current source responsive to the signal at terminal D to sink a constant current magnitude, $I_{PD}$ to integrator means 18 when the signal at terminal D is at a logical 0 and to sink essentially no current from integrator means 18 when the signal at terminal D is at a logical 1. Both charge pumps, 14 and 16, are matched as closely as practical to provide equal magnitude output currents of opposite polarity so that when both charge pumps are switched on, no net charge is delivered to integrator means 18.

An embodiment of the integrator means 18 is shown in FIG. 2 as a low pass filter comprising resistors 54, 55 and capacitors 56, 57. The voltage output on terminal 22 of such filter, assuming no leakage through capacitors 56, 57 and no loading on terminal 22, is the time integral of the current provided to capacitor 56. Thus, the voltage output on terminal 22 is proportional to the total net charge delivered by charge pumps 14 and 16. Alternate integrator means may include active elements such as operational amplifiers to provide a voltage output proportional to the time integral of current $I_{PU}$ and $I_{PD}$. Other types of active or passive integrator means may be used in conjunction with a controlled oscillator so long as a control output signal is provided to such subsequent controlled oscillator, wherein such controlled output signal is representative of the net charge provided by said charge pumps 14 and 16.

What is claimed is:

1. In a digital phase comparator apparatus for comparing the phase of a first input signal to the phase of a second input signal, and providing an output control signal at an output circuit node corresponding to the relative phase difference between said first and second input signals, said phase comparator apparatus including first, second, third and fourth flip-flops each having respective input terminals for setting and resetting thereof, and each flip-flop having a respective output terminal for indicating its state, means connecting said first, second, third and fourth flip-flops as a digital phase comparator, that means including means responsive to said first input signal for setting said first flip-flop, means responsive to the reset state of said first flip-flop for setting said second flip-flop, means responsive to the reset state of said second flip-flop for resetting said first flip-flop, means responsive to said second input signal for setting said third flip-flop, means responsive to the reset state of said third flip-flop for setting said fourth flip-flop, means responsive to the reset state of said fourth flip-flop for resetting said third flip-flop, means responsive to the state of said first flip-flop for providing a first digital output pulse, means responsive to the state of said third flip-flop for providing a second digital output pulse, and logic means responsive to the respective set states of said first, second, third and fourth flip-flops, for resetting said first, second, third and fourth flip-flops, said phase comparator apparatus further including a first switched current source responsive to said first digital output pulse for sourcing a predetermined current to said output circuit node, and a second switched current source responsive to said second digital output pulse for sinking current substantially equal to said predetermined current from said output circuit node, wherein for small phase differences between said first and second input signals said respective first and second digital output pulses have a time duration less than the minimum time required to turn on said first and second switched current sources respectively, thereby causing said phase comparator apparatus to exhibit a dead zone for sufficiently small phase differences between said first and second input signals in the region between phase lead and phase lag conditions, the improvement comprising:

delay means responsive to the set state of said first, second, third and fourth flip-flops for substantially increasing the time required for said logic means to reset said first, second, third and fourth flip-flops, thereby increasing the minimum time duration of said first and second digital output pulses.

2. A digital phase comparator apparatus according to claim 1 wherein the delay introduced by said delay means is substantially equal to or greater than the delay corresponding to the minimum respective time duration of said first and second digital output pulses required to turn on said first and second switched current sources.

3. A digital phase comparator apparatus according to claim 1 wherein the delay introduced by said delay means is slightly greater than the delay corresponding to the minimum respective time duration of said first and second digital output pulses required to turn on said first and second switched current sources.

4. A digital phase comparator apparatus according to claims 1, 2 or 3 wherein said logic means comprises a gate having first, second, third and fourth input terminals and an output terminal, the respective input terminals of said gate being connected to a respective output terminal of said first, second, third and fourth flip-flops so that said gate provides output indication when said first, second, third and fourth flip-flops are in a set state; and wherein said delay means is connected between said output terminal of said gate and respective reset terminals of said first, second, third and fourth flip-flops.

5. A digital phase comparator apparatus according to claim 4 wherein said delay means comprises a plurality of logic inverters connected in series, said series connected plurality of inverters being connected at the input thereof to said output terminal of said gate, said series connected plurality of inverters being connected at the output thereof to the reset terminals of said first, second, third and fourth flip-flops.

6. A digital phase comparator apparatus according to claim 1, 2 or 3 further including integrator means connected to said output circuit node for providing an output control signal voltage representative of the net charge provided at said output circuit node.

7. A digital phase comparator apparatus according to claim 6 further including a voltage controlled oscillator responsive to said output control signal voltage for providing an output signal of a frequency proportionally related to said output control signal voltage, wherein said voltage controlled oscillator output signal provides said second input signal to said digital phase comparator apparatus.

8. An apparatus according to claim 1, 2 or 3 wherein said first and second switched current sources each comprise:

first and second terminals for receiving an operating potential therebetween;

input and output terminals;

a constant current source having first and second electrodes, said constant current source connected at one electrode thereof to said second terminal;

first and second transistors having respective first and second electrodes defining the ends of a principal current conduction path, and respective third electrode, the potential between respective first and third electrodes controlling the respective current through its respective principal current conduction path;

means connecting said first and second transistors as a differential amplifier responsive to an input signal at said first input terminal, that means comprising a connection from the first electrodes of said first and second transistors to the second electrode of said constant current source, a connection from said input terminal to the third electrode of said first transistor, and a biasing means for applying a bias voltage to the third electrode of said second transistor;

a current mirror amplifier having input, output and common terminals;

means connecting the input terminal of said current mirror amplifier to the second electrode of said first transistor;

means connecting the output terminal of said current mirror amplifier to the second electrode of said second transistor;

means connecting the common terminal of said current mirror amplifier to said first terminal; and said output terminal being connected to the output terminal of said current mirror amplifier.

9. An apparatus according to claim 8 wherein said means connecting the input terminal of said current mirror amplifier to the second electrode of said first transistor, and said means connecting the output terminal of said current mirror amplifier to the second electrode of said second transistor each comprises a unidirectional current conduction means poled forward conduction through the respective principal current conduction path of said first and second transistors.

* * * * *